United States Patent
Pannetier et al.

(10) Patent No.: US 8,415,774 B2
(45) Date of Patent: Apr. 9, 2013

(54) SCREENED ELECTRICAL DEVICE AND A PROCESS FOR MANUFACTURING THE SAME

(75) Inventors: Myriam Pannetier, Gif-sur-Yvette (FR); Claude Fermon, Orsay (FR); Béatrice Bonvalot, Meylan (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 11/579,365

(22) PCT Filed: Apr. 27, 2005

(86) PCT No.: PCT/EP2005/004636
§ 371 (c)(1),
(2), (4) Date: Mar. 4, 2008

(87) PCT Pub. No.: WO2005/106953
PCT Pub. Date: Nov. 10, 2005

(65) Prior Publication Data
US 2011/0068441 A1 Mar. 24, 2011

(30) Foreign Application Priority Data
May 3, 2004 (EP) .................................... 04291122

(51) Int. Cl.
*H01L 23/552* (2006.01)
(52) U.S. Cl.
USPC ........... 257/659; 257/660; 257/662; 257/663; 257/E21.499; 257/E23.114

(58) Field of Classification Search .................. 257/659, 257/E21.499, 660, 662, 663, E23.114
See application file for complete search history.

(56) References Cited

U.S. PATENT DOCUMENTS

| | | | |
|---|---|---|---|
| 5,138,431 A | 8/1992 | Huang et al. | |
| 6,121,544 A * | 9/2000 | Petsinger | 174/353 |
| 6,767,592 B2 * | 7/2004 | Gui et al. | 427/553 |
| 2003/0098469 A1 | 5/2003 | Spielberger et al. | |
| 2003/0102544 A1 | 6/2003 | Nishikawa | |
| 2003/0132494 A1 * | 7/2003 | Tuttle et al. | 257/433 |
| 2003/0193759 A1 * | 10/2003 | Hayashi | 360/324.1 |

FOREIGN PATENT DOCUMENTS

| | | |
|---|---|---|
| CA | 2 092 371 | 9/1994 |
| EP | 0 360 055 | 3/1990 |
| WO | WO 03/034496 | 4/2003 |
| WO | WO 2004/064149 | 7/2004 |

\* cited by examiner

*Primary Examiner* — Junghwa M Im
(74) *Attorney, Agent, or Firm* — Preti Flaherty Beliveau & Pachios LLP

(57) ABSTRACT

A protected electrical device having at least one electrical sub-assembly (1) to be protected comprises on at least one (11) of upper and lower surfaces (11, 12), at least a screening layer (2) against the electromagnetic (EM) and radiofrequency (RF) fields emitted by the electrical sub-assembly (1). The screening layer (2) comprises at least a first layer made of soft magnetic material with a high relative permeability (µr) larger than 500. The screening layer (2) is placed on substantially the whole surface of said at least one (11) of the upper and lower surfaces (11, 12), except on predetermined regions (1*a*) of limited area, the electrical connections (8, 9) with external devices being located on at least some of the predetermined regions of limited area.

31 Claims, 2 Drawing Sheets

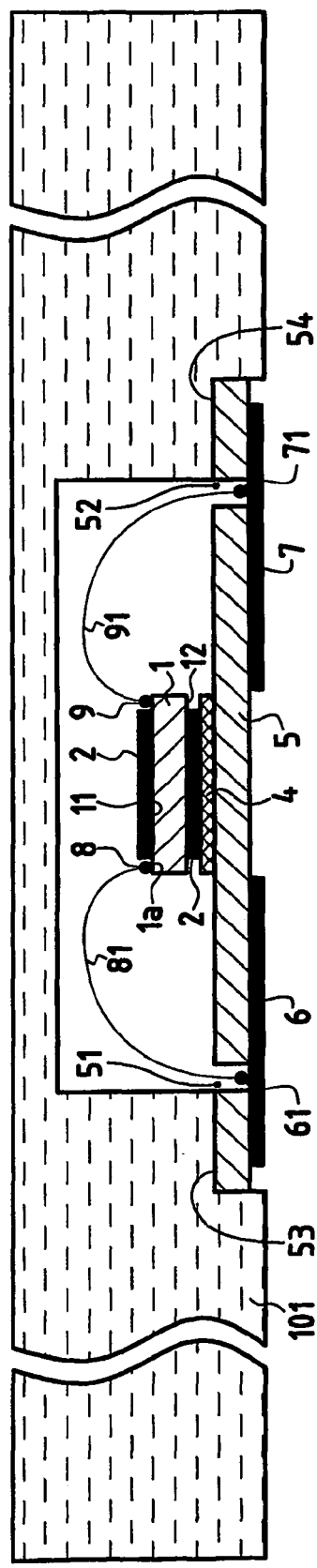

SCREENED ELECTRICAL DEVICE AND A PROCESS FOR MANUFACTURING THE SAME

This application is a §371 national phase filing of PCT/EP2005/004636 filed Apr. 27, 2005, and claims priority to European application No. 04 291122.2 filed May 3, 2004.

The present invention relates to a screened electrical device having at least one electrical sub-assembly to be protected. The invention further relates to a process for manufacturing such a screened electrical device.

The invention more particularly relates to the protection of flat portable electrical devices containing active electrical sub-assemblies such as integrated circuits (IC), in particular crypto-processors, and having electrical contacts for external interactions.

In such objects, the electrical currents circulating in the wires of an IC or between components of an electrical device create magnetic fields in a frequency range from low frequencies up to frequencies of several gigahertz depending on the working frequency.

A local detection of these magnetic fields by a magnetic sensor provides a direct measurement of circulating currents and hence of the local activity of the IC. It is thus possible for unauthorized people to electromagnetically detect the electrical device activity and to therefore have access to confidential information.

The present invention aims at preventing unauthorized persons to detect the radio and hyperfrequencies emissions of an electrical device comprising an electrical sub-assembly to be protected incorporated in a flat portable object.

Another aim of the present invention is to protect the electrical device against light and infrared manipulation of the active components of the electrical device.

Still another aim of the invention is to provide an electrical device which presents a high mechanical resistance against removal by chemical or ionic etching.

These aims are obtained due to a protected electrical device having at least one electrical sub-assembly to be protected, the electrical device having an upper surface, a lower surface and electrical connections for external interaction, characterized in that it further comprises on at least one of the upper and lower surfaces, at least a screening layer against the electromagnetic and radiofrequency fields emitted by said electrical sub-assembly, said screening layer comprising at least a first layer made of soft magnetic material with a high relative permeability larger than 500, said screening layer being placed on substantially the whole surface of said at least one of the upper and lower surfaces, except on predetermined regions of limited area, said electrical connections with external devices being located on at least some of said predetermined regions.

The electrical sub-assembly to be protected may comprise at least one integrated circuit.

The electrical connections are preferably located in a peripheral region of the electrical sub-assembly to be protected.

The screening layer comprising at least one soft magnetic layer guides the electromagnetic RF and HF fields and has a screening effect preventing an outside measurement.

The screening layer further blocks light penetration in the infrared, visible and near ultraviolet frequency domains.

The composition of the screening layer may be chosen for having a maximized resistance against chemical and ionic etching.

Preferably the first layer of the screening layer comprises a material containing alloys of Fe, Ni or Co and more especially a material containing anyone of the following alloys: NiFe alloys, CoNi alloys, CoZr alloys.

The first layer may have a thickness between 2 and 40 µm and preferably between 10 and 30 µm.

The screening layer may further comprise a seed layer of Ti or oxide disposed between the electrical sub-assembly to be protected and the first layer.

The seed layer may have a thickness between 8 and 100 nm and preferably between 10 and 20 nm.

The screening layer may advantageously further comprise an additional outer layer which is a mechanically hard layer exhibiting a good resistance to mechanical polishing or chemical etching.

The additional outer layer may be made of Ti or may comprise amagnetic oxides such as $SiO_2$ or $Al_2O_3$ (alumina).

The additional outer layer may alternatively comprise diamond-like carbon or a chemical-resistant magnetic material such as a Co-based compound.

The additional outer layer may have a thickness between 1 and 2 µm.

According to a preferred embodiment, the electrical device further comprises a perturbation layer made on said screening layer, said perturbation layer comprising an inhomogeneous hard magnetic material able to induce strong magnetic perturbation, at least of the same order of magnitude than the electromagnetic and radiofrequency fields emitted by said electrical sub-assembly.

According to a specific embodiment, the perturbation layer comprises hard magnetic particles incorporated in a matrix.

According to a specific embodiment, the perturbation layer has a surface exhibiting a natural roughness which induces a magnetic inhomogeneity that enhances the perturbation effect.

According to another specific embodiment, the perturbation layer has an artificial roughness obtained by a patterned configuration: some parts of the surface to be protected having no soft magnetic layer while some others parts have the soft magnetic layer. Advantageously, the parts having the soft magnetic layer are designed spotted above the very places of the circuit generating the stronger or the most informative electrical signals.

The perturbation layer may comprise fluctuating magnetic particles incorporated in a non magnetic matrix which can be either a metallic, an insulating or an organic matrix.

The perturbation layer comprises a hard magnetic material which preferably comprises at least one of the following materials: CoPt, FePt, NdFeB, $SmCo_5$, FeTb.

The perturbation layer may have a thickness between about 1 and 10 µm.

The perturbation layer may have either an artificial roughness, or an artificial roughness due to the application process (i.e. plasma spraying) or by application in a patterned way.

Screening layers with or without perturbation layers may be disposed both on the upper and lower surfaces of the electrical sub-assembly of the electrical device.

The invention also relates to a process for manufacturing a protected electrical device having an electrical sub-assembly to be protected, the electrical device having an upper surface and a lower surface, and electrical connections for external interactions, characterized in that it comprises the step of forming at least on one of the upper and lower surfaces at least a screening layer against the electromagnetic and radiofrequency fields emitted by said electrical sub-assembly, said step of forming said screening layer comprising at least placing a first layer made of soft magnetic material with a high relative permeability $\mu_r$ larger than 500, substantially on the whole surface of said at least one of the upper and lower surfaces except on predetermined regions of limited area, said electrical connections being located on at least some of said predetermined regions.

The step of forming at least a screening layer may comprise the sub-steps of a) depositing by a sputtering technique a mechanically hard layer for forming a seed layer on said at least one of the upper and lower surfaces having electrical connections, and b) forming by electro-deposition a layer of soft magnetic material with high permeability.

According to a specific embodiment, said step of forming at least a screening layer further comprises patterning said screening layer by having removed portions which constitute some of said predetermined regions of limited area which may receive said electrical connections, said seed layer being patterned before said layer of soft magnetic material is deposited by electro-deposition.

Advantageously, the step of forming at least a screening layer further comprises the sub-step of forming by electro-deposition an additional final mechanically hard layer.

The process may further comprise the step of forming on said screening layer a perturbation layer comprising an inhomogeneous hard magnetic material able to induce strong magnetic perturbation, at least of the same order of magnitude than the electromagnetic and radiofrequency fields emitted by said electrical sub-assembly.

Preferably, the step of forming a perturbation layer comprises the incorporation of fluctuating magnetic particles in a non magnetic matrix.

The perturbation layer is intended to create a magnetic perturbation able to block any coherent measurement by a magnetic sensor. The perturbation layer may be either static or dynamic in the right range of frequencies.

The invention also relates to a smart-card comprising a protected electrical device with at least an electrical sub-assembly to be protected, this protected device having a screening layer against the electromagnetic and radiofrequency fields. In this particular application, the electrical device, which comprises for example a micro-processor and a memory, is embedded in a plastic card body. The invention is particularly adapted to prevent a fraudulent access to confidential information stored in the smart-card.

Other features and advantages of the invention will become more apparent from the following description of specific embodiments with respect to the enclosed drawings in which:

FIG. 1 is a schematic perspective view showing an integrated circuit protected by a magnetic screening layer above and below the integrated circuit, FIG. 2 is a schematic perspective view showing an integrated circuit protected by a magnetic screening layer on only one main side of the integrated circuit, FIGS. 3 to 8 are sectional views of different embodiments of an electrical device according to the invention, and FIG. 9 is a sectional view showing an electrical device according to the invention incorporated in a smart card.

If conventional integrated circuits (IC) are considered, typical currents traveling in wires vary from 1 µA to 500 µA. The frequencies of these currents are generally larger than 1 MHz and lower than 1 GHz.

At a distance of 5 µm from the surface of the wire, the field created is about 0.1 A/m to 50 A/m and its intensity is mainly concentrated on a finite number of frequencies linked to the clock frequency of the corresponding IC.

The sensitivity of the best magnetic sensors presently available with small sizes is about $10^{-3}$ A/m/sqrt (Hz). With a bandwidth of 1 kHz, which is a typical value, the resulting sensitivity is 0.03 A/m.

According to the invention an electrical device comprises a passive screening layer able to provide an attenuation of ca 60 dB.

Optionally, the electrical device further comprises an additional active perturbation layer which creates random fields of about 50 A/m in order to cover the wire emission of the electrical sub-assembly of the electrical device.

A perturbation layer coupled with a screening layer creates fields three orders of magnitude larger than the residual RF emission of the IC constituting an electrical sub-assembly.

FIG. 1 schematically shows an electrical device according to the invention comprising an electrical sub-assembly which may typically comprise an IC comprising for example one or more processors.

Each of the upper surface 11 and the lower surface 12 of the sub-assembly 1 is covered by a protection layer 2. Each protection layer 2 includes at least a magnetic screening layer and essentially covers the whole surface of the corresponding upper or lower surface 11, 12, except for predetermined regions of small area. Some of these regions of small area may comprise electrical connections 8, 9. Such predetermined regions may preferably comprise a peripheral region is of the sub-assembly 1, but some other areas of the upper and lower surfaces 11, 12 of the subassembly 1 may be without any protection layer.

FIG. 9 shows an electrical device according to the invention comprising an electrical sub-assembly 1 such as an IC in a smart card type embodiment.

Figure 2:
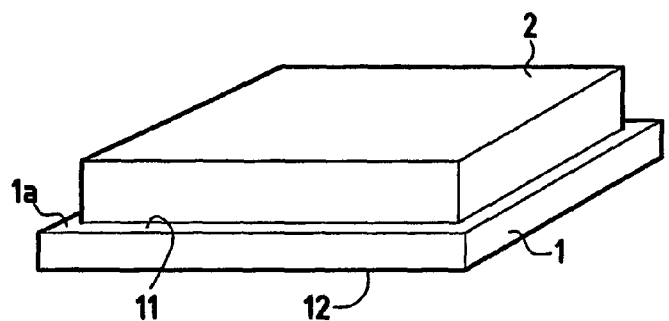
FIG. 2 is analogous to FIG. 1 but shows an IC which is protected by a protection layer 2 only on its upper surface 11.

Different preferred embodiments of the invention will be described with respect to FIGS. 3 to 8 which show different possibilities of forming the protection layer 2 of FIG. 2 on a sub-assembly 1 such as an IC.

Figure 1:
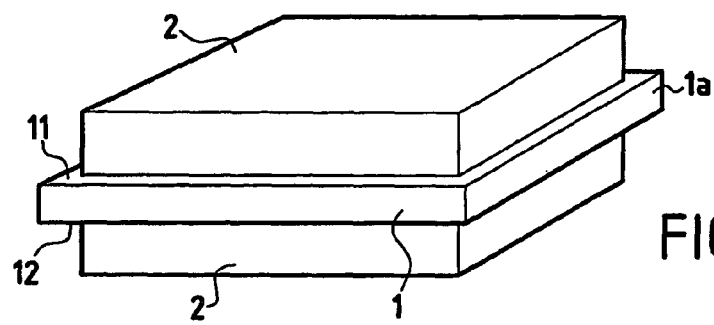

The following description will be made with respect to a single protection layer 2 provided on the upper surface 11 of the sub-assembly 1. However, the protection layer 2 provided on the lower surface 12 of the sub-assembly 1 of FIG. 1 may be manufactured according to the same process.

In FIGS. 3 to 8, the electrical connections 8, 9 that will be further indicated on FIG. 9 are not shown. They are simply located on a portion of the sub-assembly 1 which is not covered by a protection layer 2, such protection layer 2 basically comprising a screening layer 20.

The screening layer 20 essentially comprises a first layer 21 made of a soft magnetic material with a high relative permeability $\mu_r$ which is typically higher than 500.

The first layer 21 may typically have a thickness comprised between 2 and 40 µm and preferably between 10 and 30 µm.

Figure 3:
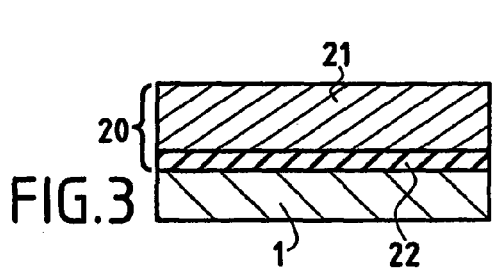

As shown on FIG. 3, the first layer 21 may be grown on a seed layer 22 made of Ti or oxide. The seed layer 22 has typically a reduced thickness between 8 and 20 nm or up to 100 nm, but preferably between 10 and 15 nm. The seed layer 22 can be patterned with holes 23.

The patterned layer 22 (FIG. 4) favors the patterned growth of the soft magnetic layer 21 with the same holes 23.

A patterned screening layer 20 formed of a seed layer 22 and a first layer 21 made of soft magnetic material corresponds to a magnetic signal which is non homogenous and therefore presents a better screening.

Figure 4:
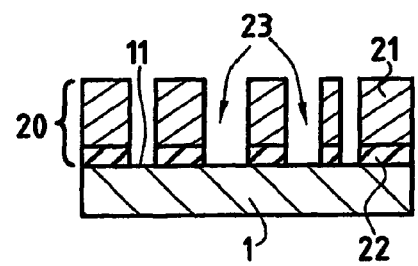
Figure 5:
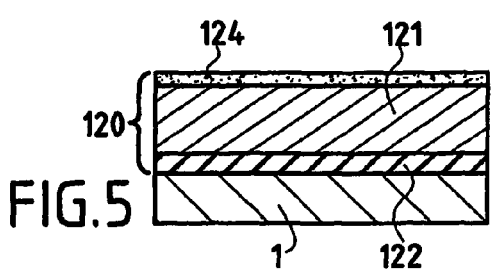
Figure 6:
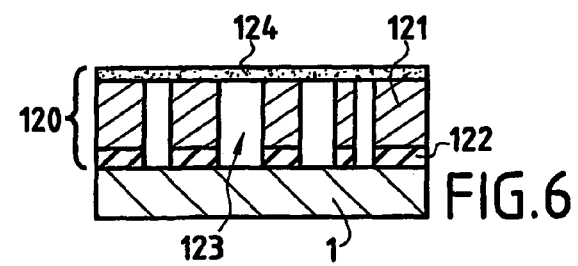

The embodiments of FIGS. 5 and 6 are similar to the embodiments of FIGS. 3 and 4 respectively and the elements with reference numerals 120, 121, 122, 123 respectively correspond to the elements with reference numerals 20, 21, 22, 23 respectively and will not be further described. However, according to the embodiments of FIGS. 5 and 6, an additional outer layer 124 is deposited on top of the first layer 121 made of soft magnetic material. The layer 124 which is intended to prevent chemical attack of the screening stack may comprise a chemical-resistant magnetic material such as a Co-based compound.

The additional outer layer 124 has a thickness between 1 and 2 µm and is a mechanically hard layer exhibiting a good resistance to mechanical polishing or chemical etching.

The additional outer layer 124 may be made of Ti or may comprise amagnetic oxides such as $SiO_2$ or $Al_2O_3$. The layer 124 may also comprise diamond-like carbon.

Various soft magnetic materials may be used for the first layer 21, 121: NiFe alloys with compositions near permalloy composition (80% of Ni and 20% of Fe), CoNi alloys, CoZr alloys or more complex systems which present a very high relative permeability $\mu_r$. A relative permeability $\mu_r$ higher than 10 000 can be obtained with this kind of material.

Limitations are given by the deposition temperature and/or annealing temperature which have to be compatible with the IC. Practically, the temperature higher limit is technology dependent around 350° C.

The thickness of the first layer 21, 121 should be as high as possible as a function of the other constraints.

For example, with a permalloy film an attenuation of 2 to 4 dB/µm is obtained. With a thickness of 10 µm an attenuation of 30 dB can be achieved. An attenuation of 60 dB is also possible with a thickness of 20 µm.

More generally the general formula giving the attenuation as a function of the thickness d of the layer and the frequency f of the RF field is:

$$a = \exp(kd/f).$$

The coefficient k depends on the material. For the permalloy $k = 0.5$ MHz·µm$^{-1}$.

The screening layer 20, 120 may also be used as a protection against light. The layer's thickness choice for screening against light is directly related to the penetration depth in the material.

If we consider light frequencies with wavelengths varying from 0.1 µm to 2 µm (near UV to IR) a good metallic layer of 2 µm is enough to screen light penetration. A good metallic layer is a layer presenting a resistivity lower than about 100 µOhm·cm. This is the case of most metallic magnetic layers like NiFe, CoZr, Co, Ni or Fe.

More generally it may be considered that for thicknesses larger than 500 nm, the soft magnetic layer acts as an opaque layer for near UV, visible and IR light due to its conducting properties, and the provision of such a protection layer avoids light excitation of the chip.

The choice of the composition of layer 21, 121 has to take into account the difficulty of etching by various methods including wet etching, reactive ion etching (RIE), ion beam etching (IBE) and IC debugging tools like focused ion beam (FIB) tools or optical focused ion beam tools known as IDS OptiFIB (which is a trademark of SCHLUMBERGER).

Layers with a Co content are difficult to etch by wet etching. Layers with Ti are difficult to etch by RIE or IBE.

A composite layer 20, 120 can also be used with a Ti or Oxide seed layer 22, 122, a permalloy layer 21, 121 and a second soft material layer 24, 124 based of Co alloy.

Deposition of the layer can be done by several techniques such as: electrodeposition, plasma spraying, screen printing, sputtering, vapor deposition (CVD, PECVD, PVD), liquid phase coating or evaporation.

Figure 7:
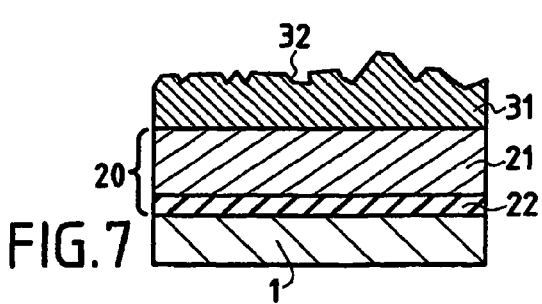
Figure 8:
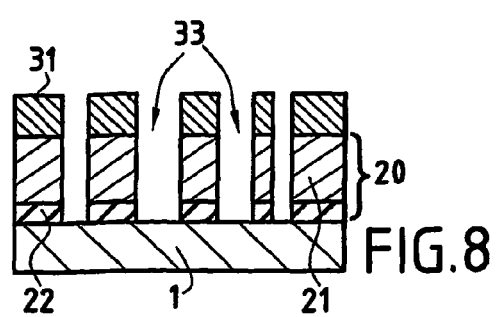

FIGS. 7 and 8 relate to specific embodiments of the invention comprising a screening layer 20 which may be made in the same manner as in the case of the embodiments of FIGS. 3 and 4, and a perturbation layer 31 which is provided on the screening layer 20.

The perturbation layer 31 aims at creating magnetic fields much larger than the fields created by the currents within the sub-assembly 1.

The perturbation layer 31 may be constituted by an inhomogeneous hard magnetic layer.

According to a possible embodiment the perturbation layer 31 comprises an inhomogeneous hard permanent magnet layer which creates external static high magnetic fields. However if a hard permanent magnet layer is homogeneous, the field created outside is very small.

Accordingly some structural or magnetic inhomogeneity is introduced in order to confer immunity against applied magnetic fields.

According to a possible embodiment the perturbation layer 31 comprises an inhomogeneous hard permanent magnet layer which creates external static high magnetic fields. However if a hard permanent layer is homogeneous, the field created outside is very small.

Accordingly, some structural or magnetic inhomogeneity is introduced. The advantage of a structural inhomogeneity is the immunity against applied magnetic fields. For that reason, it is considered as the most efficient protection.

The composition of this hard permanent magnet layer can comprise CoPt, FePt, NdFeB, $SmCo_5$ or some other rare earth/transition metal alloys like FeTb particles.

The thickness of the layer is dependent on the material: 1 to 5 µm thick films are able to create a rather large magnetic field outside the system when they are magnetized perpendicularly to the films. The thickness is related to the remanent field of the material which varies from 2 kOe (CoPt) to 20 kOe (FeNdB).

The structural inhomogeneity can be obtained mainly by three different approaches: by using a rough layer, by the patterning of the layer and by using a mixture of magnetic and non magnetic objects.

a) The roughness at the outer surface 32 of the perturbation layer 31 (FIG. 7) can be created by the deposition technique. In particular, electrodeposition is able to create very rough surfaces. An artificial roughness can also be created by a mechanical polishing of the surface 32 with coarse grains.

b) Patterning of the layer 31 and etching to create remove portions 33 is a more sophisticated technique which creates a well controlled external magnetic field (FIG. 8). A pattern whose dimensions have a size of 5 µm or lower makes the perturbation layer very efficient. Patterning of the layers 20 and 31 can be done by UV lithography. A specific design depending on the protected zones can be used. An aperture for pad connections has to be implemented. This lithographic step can be performed on a full size wafer.

c) The layer 31 can also be a non homogeneous set of magnetic material embedded in a non magnetic, insulating or conductive matrix. The magnetic material can be included in glues, resins, polyimide layers for low cost process.

A mixture of polymer resist and NdFeB particles deposited by screen printing is a rather cheap and easy approach. The NdFeB particles are randomly orientated and their coercivity can achieve 2 Tesla. The particles should be larger than 1 µm in order to avoid a zero average of the field created. Ideal size is a random distribution between 1 and 20 µm as it can be obtained by mechanical powdering.

According to still another embodiment, the perturbation layer 31 is constituted by a fluctuating magnetic layer. In this embodiment, a layer composed of fluctuating particles embedded in a non magnetic matrix is used.

Fluctuating magnetic particles are particles in the superparamagnetic regime. This regime is achieved when the size of the particle is enough small and the density of particles is enough low (typically smaller than 10% and surely smaller than the percolation concentration). Then the anisotropy energy of the particle and the Zeeman energy in the field created by the other particles is lower than the thermal energy kT.

Typical size of particles is 3 to 8 nm of diameter.

By playing on the size, fluctuating frequencies in the domain of the IC working frequency can be obtained. The relation between the size of the particles and the fluctuation frequency is given by: $f=f_0 \exp(-K_1 V\mu/kT)$ where K1 is the anisotropy constant, V is the volume of the particle, $\mu$ the unitary moment, k the Boltzmann constant and T the working temperature, and $f_0$ is the elementary frequency which is of the order of $10^9$ Hz.

The magnetic composition of the particles is not important. The non magnetic matrix can be either a metallic or an insulating matrix.

Fabrication of the particles can be done either by a chemical approach, or by a deposition technique.

The perturbation layer 31 may be formed on the screening layer 120 of the embodiments of FIGS. 5 and 6 as well as on the screening layer 20 of the embodiments of FIGS. 3 and 4.

The protection device according to the invention obviously applies to a smart-card comprising at least an active electrical sub-assembly 1. In this case, the protection device according to the invention comprises at least on said one (11) of the upper and lower surfaces 11, 12, at least a screening layer 2 (which is similar to the screening layer 20, 120 of the previous figures) against the electromagnetic (EM) and/or radiofrequency (RF) fields emitted by the electrical sub-assembly 1, the screening layer 2 comprising at least a first layer 21 or 121 made of soft magnetic material with a high relative permeability $\mu_r$ larger than 500, the screening layer 2 being placed on substantially the whole surface of the at least one (11) of the upper and lower surfaces 11, 12, allowing layer-free predetermined regions 1a, 23, 123 of limited area for the electrical connections with external devices.

In a preferred embodiment shown on FIG. 9, the protection device according to the invention comprises on both upper and lower surfaces 11, 12 at least a screening layer 2, similar to the screening layer 20 or 120 of the previous figures, against the electromagnetic (EM) and/or radiofrequency (RF) fields emitted by the electrical sub-assembly 1, the screening layer 2 comprising at least a first layer 21 or 121 made of soft magnetic material with a high relative permeability $\mu_r$ larger than 500, the screening layer 2 being placed on substantially the whole surface of both the upper and lower surfaces 11, 12, allowing layer-free predetermined regions 1a, 23, 123 of limited area for the electrical connections 8, 9 with external devices.

Electrical connections 8, 9 may be located on the upper surface 11 of the sub-assembly 1 in a peripheral portion 1a of the sub-assembly 1.

Protection layers 2 may be provided on substantially the whole upper surface 11 and the whole lower surface 12 of the sub-assembly 1 except for peripheral region 1a.

The sub-assembly 1 comprises for example a processor and a memory. It is mounted, together with its two protection layers 2, on an epoxy substrate 5 by means of a glue layer 4.

The electrical connections 8, 9 of the sub-assembly 1 are linked through wires 81, 91 such as gold wires, to contact pads 6, 7 provided on the lower side of the epoxy substrate 5.

The wires 81, 91 cross holes 51, 52 made in the substrate 5 and are connected to the contact pads 6, 7, e.g. through NiCu/gold contacts.

The epoxy substrate 5 is embedded in a plastic card body 101 wearing a blind hole whose depth is such that it may contain at least the sub-assembly 1, the protective layers 2, the wires 81, 91 and the epoxy substrate 5. The plastic card body 101 presents a recessed plane surface 53, 54 whose shape may be circular or rectangular and whose depth depends on the thickness of the epoxy substrate 5, in such a way that the external face of the contact pads 6, 7 is approximately in the same plane as the lower face of the plastic card body 101, generally wearing printed patterns, inscriptions or drawings. The epoxy substrate 5 is generally glued on that recessed plane surface 53, 54.

Another aim of the present invention is to perform a process for manufacturing a protected electrical device having an electrical sub-assembly 1 to be protected, this electrical device having an upper surface 11 and a lower surface 12 and having electrical connections for external interactions, characterized in that it comprises the step of forming on at least one (11) of the upper and lower surfaces 11, 12 at least a screening layer 2 similar to the screening layer 20 or 120 of the previous figures against the electromagnetic (EM) and radiofrequency (RF) fields emitted by the electrical sub-assembly 1, the step of forming the screening layer 2 comprising at least placing a first layer 21, 121 made of soft magnetic material with a high relative permeability $\mu_r$ larger than 500, substantially on the whole surface of the at least one (11) of the upper and lower surfaces 11, 12 except on predetermined regions 1a, 23, 123 of limited area, the electrical connections 8, 9 being located on at least some (1a) of the predetermined regions 1a, 23, 123.

Advantageously, the process according to the invention comprises, in the step of forming at least a screening layer 2, the sub-steps of:

a) depositing by a sputtering technique a mechanically hard layer for forming a seed layer 22, 122 on the at least one (11) of the upper and lower surfaces 11, 12 having electrical connections 8, 9, and b) forming by electro-deposition a layer 21, 121 of soft magnetic material with high permeability.

Advantageously, the process according to the invention further comprises, in the step of forming at least a screening layer 2, patterning the screening layer 2 by having removed portions 23, 123 which constitute some of the predetermined regions 1a, 23, 123 which constitute some of the predetermined regions 1a, 23, 123 of limited area which may receive the electrical connections 8, 9, the seed layer 22, 122 being patterned before the layer 21, 121 of soft magnetic material is deposited by electro-deposition.

Advantageously, the process according to the invention further comprises in the step of forming at least a screening layer 2, the sub-step of forming by electro-deposition an additional final mechanically hard layer 124.

Advantageously, the process according to the invention further comprises the step of forming on the screening layer 2, a perturbation layer 31 comprising an inhomogeneous hard magnetic material able to induce strong magnetic perturbation, at least of the same order of magnitude than the electromagnetic (EM) and radiofrequency (RF) fields emitted by the electrical sub-assembly 1.

Advantageously, the process according to the invention comprises in said step of forming a perturbation layer 31, the incorporation of fluctuating magnetic particles in a non magnetic matrix.

Some practical examples will be given herebelow.

EXAMPLE 1

The screening layer 120 is composed of a trilayer: Ti, 10 nm (layer 122); NiFe, 20 μm (layer 121) and CoZr, 1 μm (layer 124). The thickness can be varied but a total thickness between 20 to 40 μm appears to be an optimal choice.

The perturbation layer 31 is made of a hard magnetic layer of NdFeB deposited by screen printing.

1) The Ti seed layer 122 of 10 nm is deposited by a sputtering technique. The layer is deposited at room temperature; the speed of deposition is about 2 nm per second at 200 W for a target/sample distance of 8 cm. A resist mask can then be deposited and the seed layer etched in areas 123 following a specific design. An alternative would be to deposit the Ti seed layer 122 after the resist mask creation and to use a lift off process.

2) The second step is to grow by electrodeposition a NiFe layer 121 of 20 μm thick on the Ti seed layer 122. Typical speed for NiFe deposition is 1 μm per minute. Homogeneity of temperature and concentration of the solution allows to obtain a rather flat NiFe layer.

3) A CoZr final layer 124 is then deposited by electrodeposition.

4) The perturbation layer 31 is made of NdFeB particles with sizes varying from 1 to 20 μm, included in a polyimide resist. The thickness of the layer should be larger than 1 μm.

EXAMPLE 2

The screening layer 120 is composed of a trilayer: Ti, 10 nm (layer 122), NiFe, 20 μm (layer 121) and CoZr, 1 μm (layer 124). The thickness can be varied but a total thickness between 20 to 40 μm appears to be an optimal choice.

The perturbation layer 31 is made of a hard magnetic layer of CoPtP alloy.

1) The Ti seed layer 122 of 10 nm is deposited by sputtering technique. The layer 122 is deposited at room temperature; the speed of deposition is about 2 nm per second at 200 W for a target/sample distance of 8 cm. A resist mask can then be deposited and the seed layer etched in areas 123 following a specific design. An alternative would be to deposit the Ti seed layer after the resist mask creation and to use a lift off process.

2) The second step is to grow by electrodeposition a NiFe layer 121 of 20 μm thick on the 11 seed layer 122. Typical speed for NiFe deposition is 1 μm per minute. Homogeneity of temperature and concentration of the solution allows to obtain a rather flat NiFe layer.

3) A CoZr final layer 124 is then deposited by electrodeposition.

4) The CoPt layer 31 can be grown by electrodeposition. This can be done through a resist mask which designs a predefined pattern calculated to create a maximal perturbation. The thickness of the CoPt layer is 5 μm. In that case, the coercivity of such material can achieve 0.15 Tesla and stray fields created at the surface will be of the order of 10 mT (105 A/m).

EXAMPLE 3

The screening layer 120 is composed of a trilayer: Ti, 10 nm (layer 122), NiFe 20 μm (layer 121) and CoZr 1 μm (layer 124). The thickness can be varied but a total thickness between 20 to 40 μm appears to be an optimal choice.

The perturbation layer 31 is made of fluctuating Co particles.

1) The Ti seed layer 122 of 10 nm is deposited by sputtering technique. The layer 122 is deposited at room temperature; the speed of deposition is about 2 nm per second at 200 W for a target/sample distance of 8 cm. A resist mask can then be deposited and the seed layer etched in areas 123 following a specific design. An alternative would be to deposit the Ti seed layer after the resist mask creation and to use a lift off process.

2) The second step is to grow by electrodeposition a NiFe layer 121 of 20 μm thick on the Ti seed layer 122. Typical speed for NiFe deposition is 1 μm per minute. Homogeneity of temperature and concentration of the solution allows to obtain a rather flat NiFe layer.

3) A CoZr final layer 124 is then deposited by electrodeposition.

4) Co particles in an Ag, $Al_2O_3$ or $SiO_2$ material constitute the layer 31. Such a system has the double advantage to be rather easy to fabricate by co-sputtering for example and very hard to destroy. The right concentration of Co, around 10% is obtained by reducing the power of the sputtering Co source. The Co/Ag system is particularly easy to fabricate as the two elements are not miscible. Then, with a deposition at room temperature, very small Co particles are obtained. Increase of the size is done by an annealing at a temperature larger than 250° C. and lower than 400° C. An annealing of one hour at 250° C. is enough to obtain fluctuating particles of about 3-5 nm which is the right size to cover RF emission of the portable object.

The invention claimed is:

1. A protected electrical device having at least one electrical sub-assembly to be protected, the electrical device having an upper surface, a lower surface and electrical connections for external interaction, characterized in that it further comprises on at least one of the upper and lower surfaces at least a screening layer against the electromagnetic (EM) and radiofrequency (RF) fields emitted by said electrical sub-assembly, said screening layer comprising at least a first layer made of soft magnetic material with a high relative permeability ($\mu_r$) larger than 500, said screening layer further comprising an additional outer layer deposited on the first layer, said additional outer layer being a mechanically hard layer exhibiting a good resistance to mechanical polishing or chemical etching, said screening layer being placed on substantially the whole surface of said at least one of the upper and lower surfaces, except on predetermined regions of limited area, said electrical connections with external devices being located on at least some of said predetermined regions, and wherein the screening layer further comprises a seed layer of Ti or oxide disposed between the electrical sub-assembly and said first layer, and said seed layer has a thickness between 8 and 100 nm.

2. A protected device according to claim 1, wherein the screening layer is deposited.

3. A protected device according to claim 2, wherein:

said electrical sub-assembly comprises at least one integrated circuit;

said electrical contacts are located on a peripheral region of the electrical sub-assembly;

said first layer of said screening layer is selected from the group comprising a material containing alloys of Fe, Ni or Co;

said first layer of said screening layer is selected from the group comprising NiFe alloys, CoNi alloys, or CoZr alloys;

said first layer has a thickness between 2 and 40 μm;

the screening layer further comprises a seed layer of Ti or oxide disposed between the electrical sub-assembly and said first layer;

said seed layer has a thickness between 8 and 100 nm;

said screening layer is patterned with removed portions which constitute at least some of said predetermined regions of limited area which may receive said electrical connections;

said additional outer layer is made of Ti or comprises amagnetic oxides; or comprises diamond-like carbon; or comprises a chemical-resistant magnetic material such as a Co-based compound;

said additional outer layer has a thickness between 1 and 2 µm;

it further comprises a perturbation layer made on said screening layer, said perturbation layer comprising an inhomogeneous hard magnetic material able to induce strong magnetic perturbation, at least of the same order of magnitude than then electromagnetic (EM) and radiofrequency (RF) fields emitted by said electrical sub-assembly;

said perturbation layer has a thickness between about 1 and 10 µm;

said perturbation layer comprises a hard magnetic material comprising at least one of the following materials: CoPt, FePt, NdFeB, SmCo$_5$, FeTb;

screening layers are deposited both on the upper and lower surfaces of said electrical sub-assembly, allowing layer-free predetermined regions of limited area for the electrical connections with external devices.

4. A smart card, characterized in that it comprises at least one protected electrical device according to claim 3.

5. A protected device according to claim 3, wherein the thickness of the seed layer is between 10 and 20 nm.

6. A protected device according to claim 3, wherein said first layer has a thickness between 10 and 30 µm.

7. A protected device according to claim 3, wherein the amagnetic oxides are selected from the group comprising SiO$_2$ or Al$_2$O$_3$.

8. A protected device according to claim 1, wherein said additional outer layer comprises amagnetic oxides.

9. A protected device according to claim 1, wherein said electrical sub-assembly comprises at least one integrated circuit.

10. A protected device according to claim 1, wherein electrical contacts are located on a peripheral region of the electrical sub-assembly.

11. A protected device according to claim 1, wherein said first layer of said screening layer is selected from the group comprising material containing alloys of Fe, Ni or Co.

12. A protected device according to claim 11, wherein said first layer of said screening layer is selected from the group comprising NiFe alloys, CoNi alloys, or CoZr alloys.

13. A protected device according to claim 1, wherein said first layer has a thickness between 2 and 40 µm.

14. A protected device according to claim 13, wherein said first layer has a thickness between 10 and 30 µm.

15. A protected device according to claim 1, wherein said screening layer is patterned with removed portions which constitute at least some of said predetermined regions of limited area which may receive said electrical connections.

16. A protected device according to claim 1, wherein said additional outer layer is made of Ti.

17. A protected device according to claim 8, wherein the amagnetic oxides are selected from the group comprising SiO$_2$ or Al$_2$O$_3$.

18. A protected device according to claim 1, wherein said additional outer layer comprises diamond-like carbon.

19. A protected device according to claim 1, wherein said additional outer layer comprises a chemical-resistant magnetic material such as a Co-based compound.

20. A protected device according to claim 1, wherein said additional outer layer has a thickness between 1 and 2 µm.

21. A protected device according to claim 1, wherein it further comprises a perturbation layer made on said screening layer, said perturbation layer comprising an inhomogeneous hard magnetic material able to induce strong magnetic perturbation, at least of the same order of magnitude than the electromagnetic (EM) and radiofrequency (RF) fields emitted by said electrical sub-assembly.

22. A protected device according to claim 21, wherein said perturbation layer comprises hard magnetic particles incorporated in a matrix.

23. A protected device according to claim 21, wherein said perturbation layer has a surface exhibiting a natural roughness which induces a magnetic inhomogeneity that enhances the perturbation effect.

24. A protected device according to claim 21, wherein said perturbation layer has an artificial roughness.

25. A protected device according to claim 24, wherein said perturbation layer is applied in a patterned way.

26. A protected device according to claim 21, wherein said perturbation layer comprises fluctuating magnetic particles incorporated in a non magnetic matrix.

27. A protected device according to claim 21, wherein said perturbation layer has a thickness between about 1 and 10 µm.

28. A protected device according to claim 21, wherein said perturbation layer comprises a hard magnetic material selected from the group comprising CoPt, FePt, NdFeB, SmCo$_5$, or FeTb.

29. A protected device according to claim 1, wherein screening layers are deposited both on the upper and lower surfaces of said electrical sub-assembly, allowing layer-free predetermined regions of limited area for the electrical connections with external devices.

30. A smart card, characterized in that it comprises at least one protected electrical device according of claim 1.

31. A protected device according to claim 1, wherein the thickness of the seed layer is between 10 and 20 nm.

* * * * *